(12) United States Patent
Ma

(10) Patent No.: US 8,451,593 B2
(45) Date of Patent: May 28, 2013

(54) ELECTRONIC DEVICE WITH A FIXING MEMBER

(75) Inventor: Liang-Chun Ma, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 376 days.

(21) Appl. No.: 12/975,227

(22) Filed: Dec. 21, 2010

(65) Prior Publication Data

US 2011/0222217 A1 Sep. 15, 2011

(51) Int. Cl.
*G06F 1/16* (2006.01)

(52) U.S. Cl.
USPC .................................................. 361/679.02

(58) Field of Classification Search
USPC .................................................. 361/679.02
See application file for complete search history.

(56) References Cited

U.S. PATENT DOCUMENTS

| | | | |
|---|---|---|---|
| 6,999,320 B2* | 2/2006 | Fan | 361/725 |
| 7,206,199 B1* | 4/2007 | Jimenez et al. | 361/679.02 |
| 7,448,702 B2* | 11/2008 | Chen et al. | 312/223.2 |
| 7,483,263 B2* | 1/2009 | Chen et al. | 361/679.02 |
| 7,486,506 B2* | 2/2009 | Chen et al. | 361/679.02 |
| 2003/0210529 A1* | 11/2003 | Chen | 361/725 |
| 2006/0092603 A1* | 5/2006 | Chen et al. | 361/683 |
| 2006/0291155 A1* | 12/2006 | Chen et al. | 361/683 |

* cited by examiner

*Primary Examiner* — Lisa Lea Edmonds
(74) *Attorney, Agent, or Firm* — Altis Law Group, Inc.

(57) ABSTRACT

An electronic device includes an enclosure and a fixing member. The enclosure defines an accommodating hole and includes a bottom wall defining a pair of receiving portions. Centers of the pair of receiving portions define a straight line. The accommodating hole is configured on a perpendicular bisector of the straight line. The fixing member includes a guiding part, a pair of sliding portions, a control portion and a resilient member. The guiding part and the bottom wall cooperatively define a receiving room receiving the sliding portions. Each of the pair of sliding portions includes a hooking portion and a blocking portion. The control portion includes a fixing portion received in the receiving room and an operating portion passing through the accommodating hole. The resilient member includes a pair of driving ends engaging with the hooking portions and a triggering end engaging with the fixing portion.

9 Claims, 7 Drawing Sheets

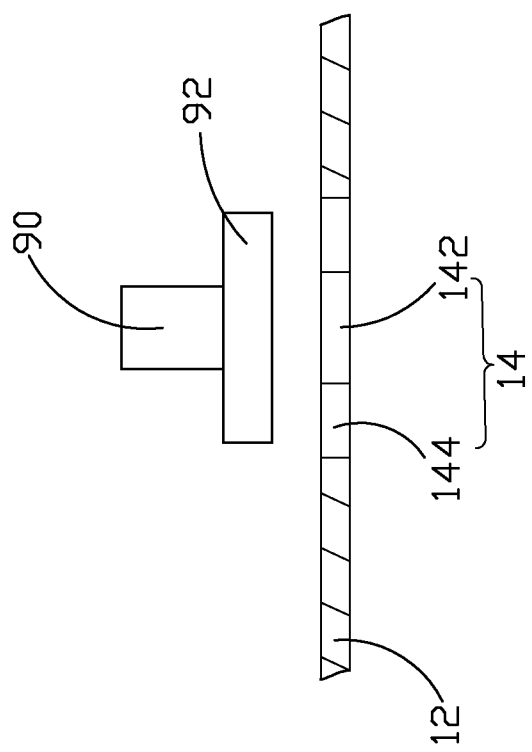

ELECTRONIC DEVICE WITH A FIXING MEMBER

BACKGROUND

1. Technical Field

The present disclosure relates to electronic devices, and more particularly to a fixing member of an electronic device.

2. Description of Related Art

Many electronic devices, such as IP phones, or LCD TVs, are mounted on walls by use of bolts or other fasteners. Generally, these electronic devices are configured with a groove to receive the bolts or fasteners. However, the electronic devices are not configured with a structure to secure the electronic device to the fastener, which would lead to potential disengagement of the electronic device from the fastener, and correspondingly result in damages of the electronic devices.

Therefore, a need exists in the industry to overcome the described limitations.

BRIEF DESCRIPTION OF THE DRAWINGS

FIG. 7 is a schematic, exploded view of part of an enclosure with a receiving portion and a fastener.

DETAILED DESCRIPTION

Figure 1:
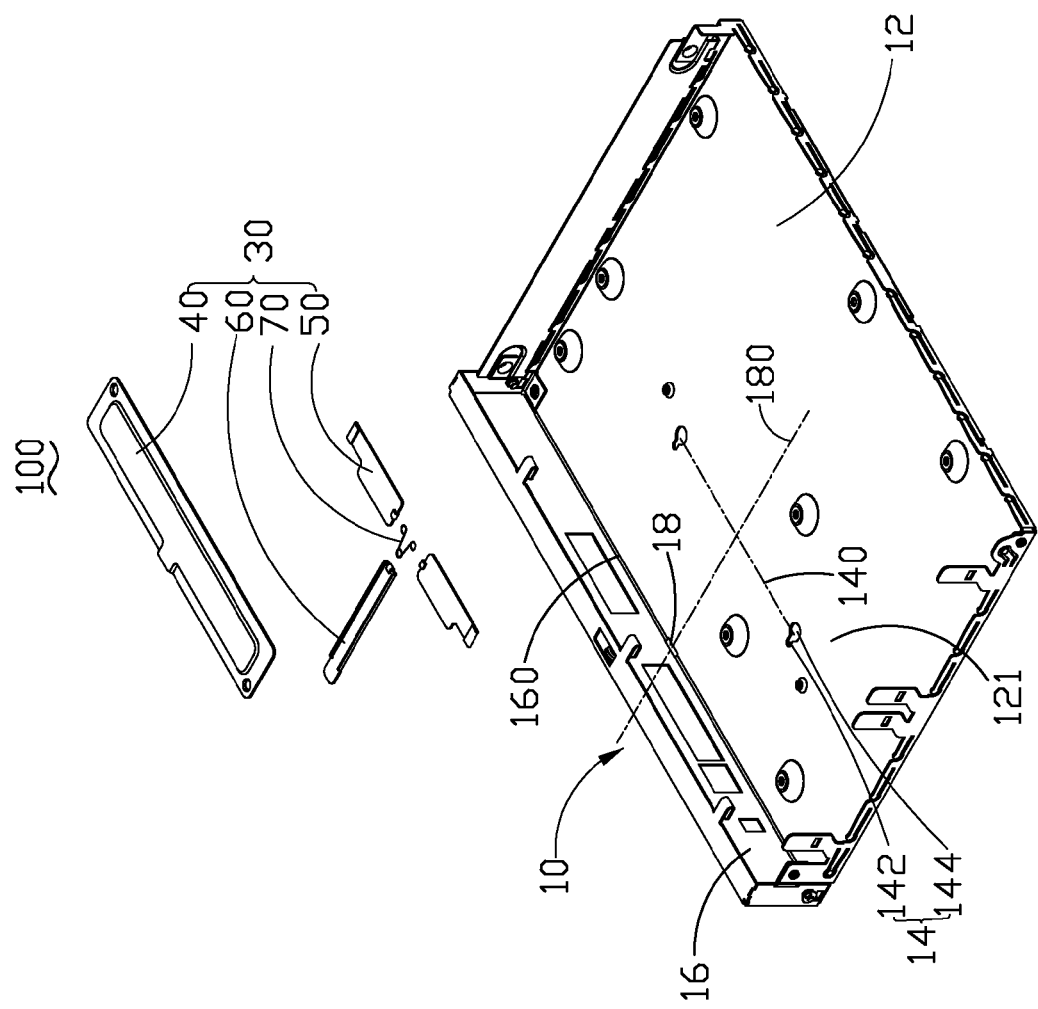
FIG. 1 is an exploded, isometric view of an electronic device of an exemplary embodiment of the disclosure.

Referring to FIG. 1, an electronic device 100 of an exemplary embodiment of the present disclosure is illustrated. The electronic device 100 includes an enclosure 10 and a fixing member 30. The electronic device 100 may be but not limited to a phone, a router, a switch, or an LCD TV, for example.

The enclosure 10 accommodates electronic components, such as printed circuit boards (PCBs) and/or hard disc drives (HDDs). Although the illustrated embodiment shows the enclosure 10 being substantially rectangular, it would be understood that other configurations, shapes, or structures may be utilized with equal applicability. In this embodiment, the enclosure 10 includes a bottom wall 12 and a plurality of sidewalls 16 (two sidewalls shown). The bottom wall 12 defines a pair of receiving portions 14. In this embodiment, the receiving portion 14 is an approximately gourd-shape hole, which includes a first receiving hole 142 and a second receiving hole 144 in communication with the first receiving hole 142. Referring to FIG. 7, area of a head 92 of a fastener 90 on a vertical surface (e.g., a wall) is greater than an area of the first receiving hole 142, and is less than an area of the second receiving hole 144.

One of the sidewalls 16 which is in parallel with a straight line 140 defined by centers of the two receiving portions 14 defines an accommodating hole 18. The accommodating hole 18 is configured on a perpendicular bisector 180 of the straight line 140. In this embodiment, the accommodating hole 18 is defined in a common border 160 of the sidewall 16 and the bottom wall 12.

Figure 2:
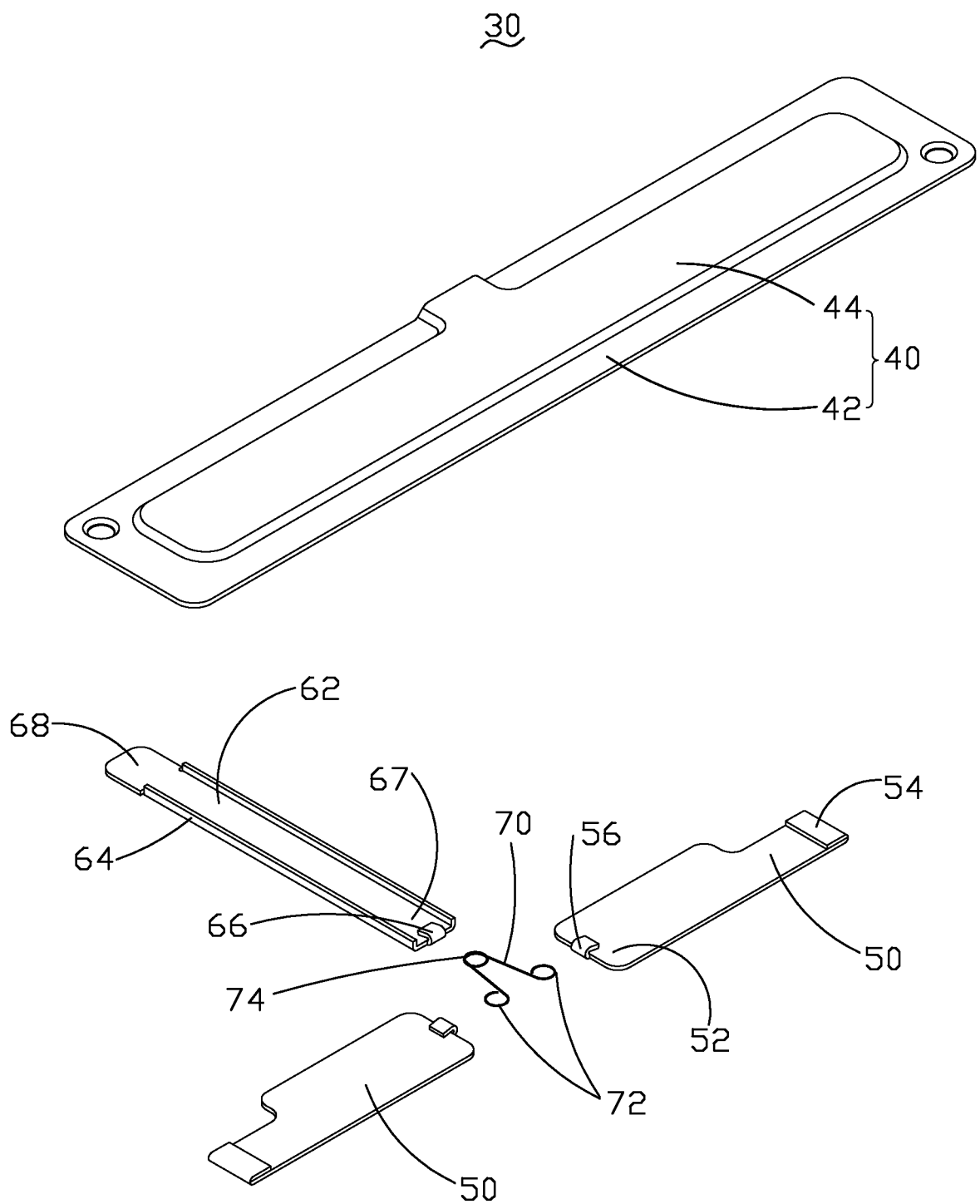
FIG. 2 is an exploded, isometric view of a fixing member of the electronic device of FIG. 1.

The fixing member 30 is attached to the bottom wall 12 of the enclosure 10 to prevent the enclosure 10 from disengaging from the fastener 90. Referring to FIG. 2, the fixing member 30 includes a guiding part 40, a pair of sliding portions 50, a control portion 60, and a resilient member 70.

Figure 6:
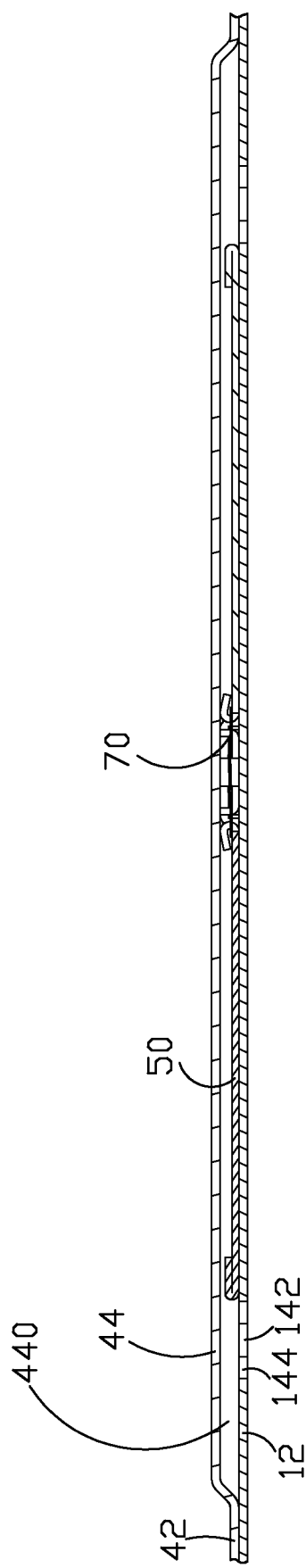
FIG. 6 is a partially cross section view of FIG. 3, showing a fixing member fixed in an enclosure.

The guiding part 40 includes a main body 42 attached to an inner surface 121 of the bottom wall 12, and a receiving portion 44 projecting from the main body 42. The receiving portion 44 and the inner surface 121 collectively define a receiving room 440, as shown in FIG. 6, to receive the pair of sliding portions 50, the resilient member 70 and part of the control portion 60. In this embodiment, the receiving portion 44 is substantially T-shaped.

The sliding portions 50 are both received in the receiving room 440, and snugly move along the straight line 140 toward to or away from each other, as well as relative to the bottom wall 12 of the enclosure 10. Each of the sliding portions 50 comprises a hooking portion 52 and a blocking portion 54 respectively located two ends of corresponding sliding portion 50. The hooking portion 52 is connected to the resilient member 70. The blocking portion 54 is used to block the second receiving hole 144. In this embodiment, the hooking portion 52 comprises a first hook 56 to engage with the resilient member 70.

The control portion 60 snugly moves along the perpendicular bisector 180 relative to the bottom wall 12 of the enclosure 10. The control portion 60 comprises a base portion 62, a pair of limiting portions 64, a fixing portion 67 and an operating portion 68. The base portion 62 is connected between the fixing portion 67 and the operating portion 68. The fixing portion 67 is received in the receiving room 440 and connected to the resilient member 70. The operating portion 68 passes through the accommodating hole 18 of the enclosure 10 for user operation. The pair of limiting portions 64 project from the base portion 62 via bending of two side edges of the base portion 62 to limit the base portion 62 move into the accommodating hole 18. In this embodiment, the fixing portion 67 comprises a second hook 66 used to engage with the resilient member 70. The second hook 66 has a same shape with the first hook 56.

The resilient member 70 comprises a pair of driving ends 72 and a triggering end 74. In this illustrated embodiment, the resilient member 70 is a substantially V-shaped torsion spring. The pair of driving ends 72 are respectively configured at two opposite ends of the resilient member 70 and are fixed to the first hooks 56 of the hooking portions 52. The triggering end 74 is configured at middle part of the resilient member 70 and is engaged with the second hook 66 of the fixing portion 67.

Figure 3:
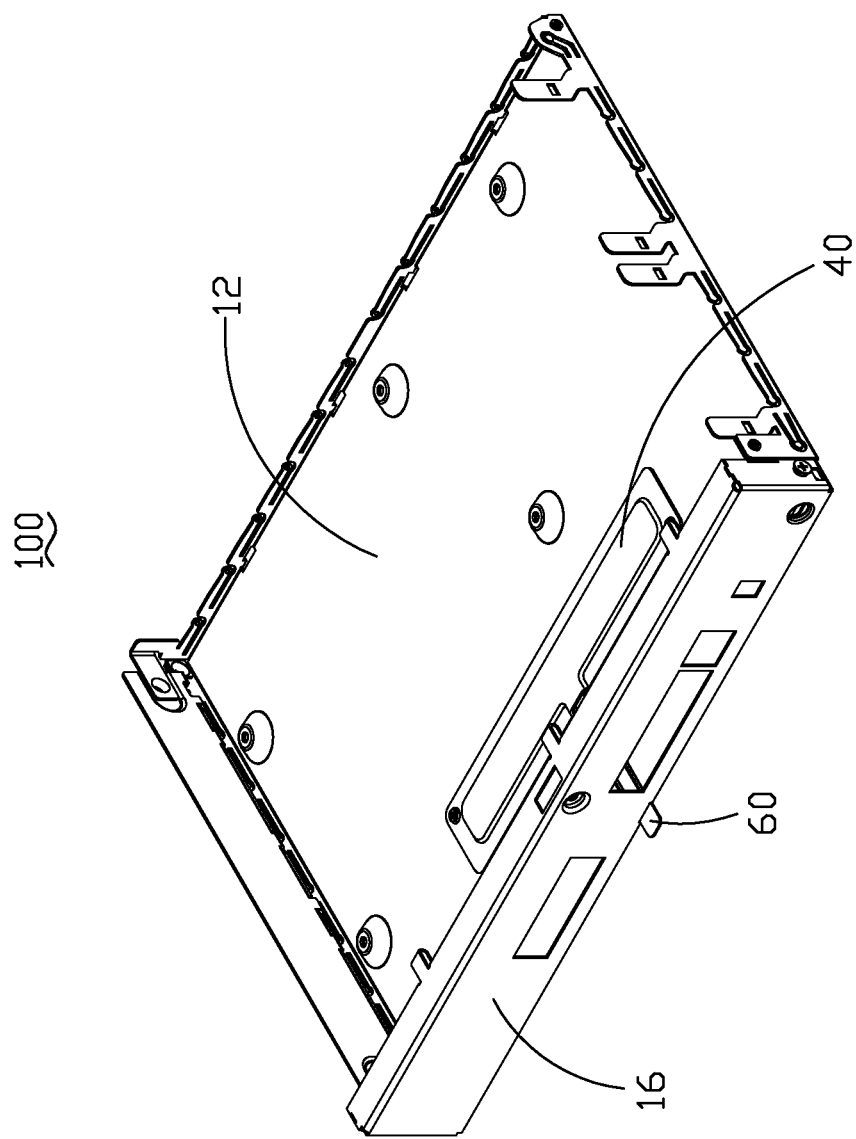
FIG. 3 is an assembled view of FIG. 1.

Referring to FIG. 3, in assembly, the pair of driving ends 72 of the resilient member 70 are respectively fixed to the first hooks 56 of the sliding portions 50. The triggering end 74 of the resilient 70 is fixed to the second hook 66 of the control portion 60. The operating portion 68 of the control portion is held in the accommodating hole 18 of the enclosure 10. The guiding part 40 is installed to the inner surface 121 of the bottom wall 12 to form the receiving room 440 to receive the pair of sliding portions 50, the resilient member 70 and the fixing portion 67. Due to the restrictions of the accommodating hole 18 and the guiding part 40, the control portion 60 could just move along the perpendicular bisector 180. Thus, the fixing member 30 is suitably mounted on the enclosure 10.

Movements of the control portion 60 relative to the enclosure 10 along the perpendicular bisector 180 cause the blocking portions 54 of the pair of sliding portions 50 to move for covering or being away from the pair of receiving portions 14, thereby the electronic device 100 being disposed between a locked and an unlocked position.

Figure 4:
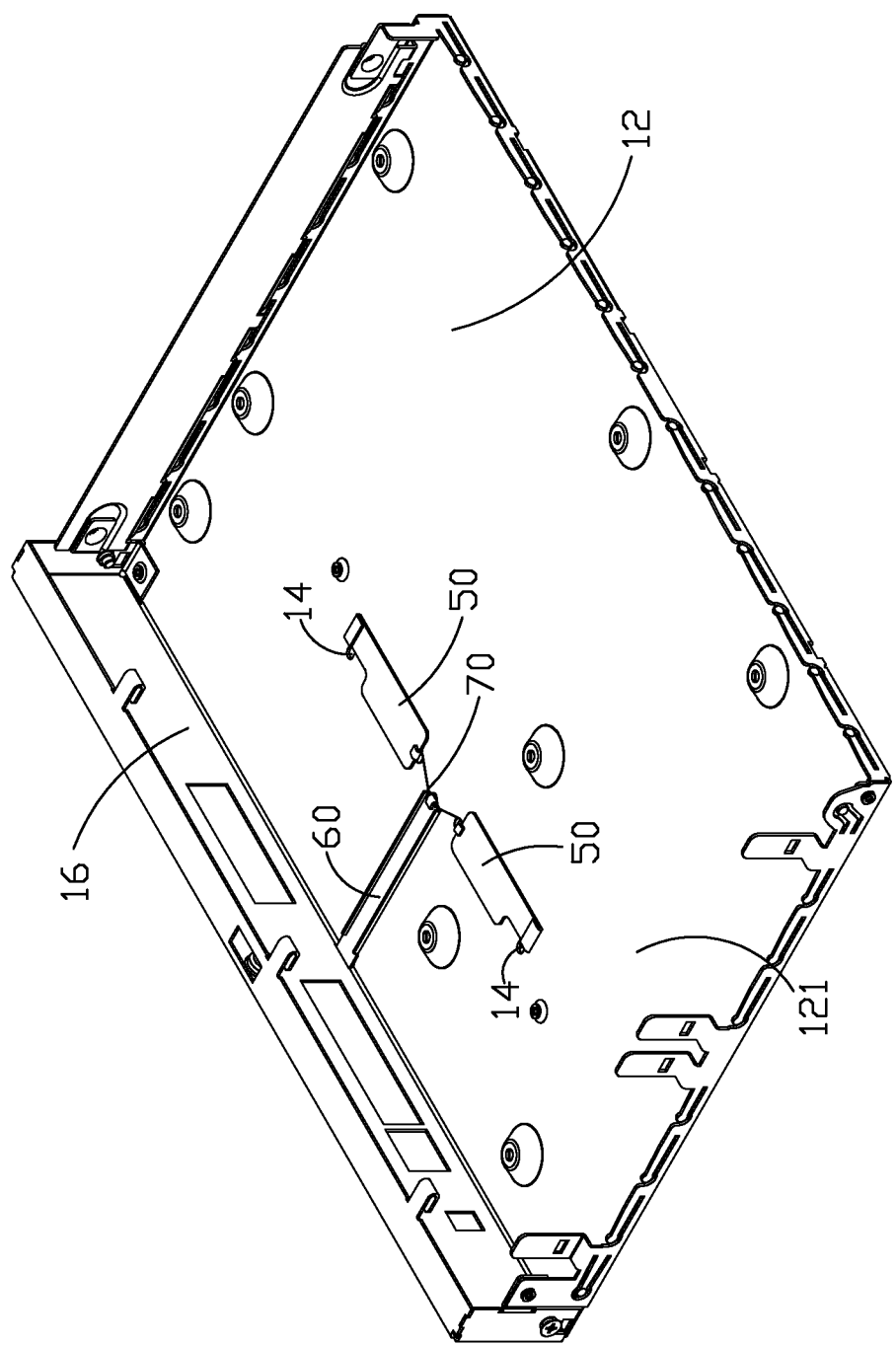
FIG. 4 is a partially assembled view of FIG. 1, showing the electronic device in a locked position.

Referring to FIG. 4, in a free status, no external force is put on the operating portion 68, and the pair of sliding portions 50 are positioned under the resilient force of the resilient member 70 in the receiving room 440, with the blocking portions 54 covering the second receiving holes 144 respectively. In this situation, the head 92 of the fasteners 90 cannot move from the first receiving holes 142.

Figure 5:
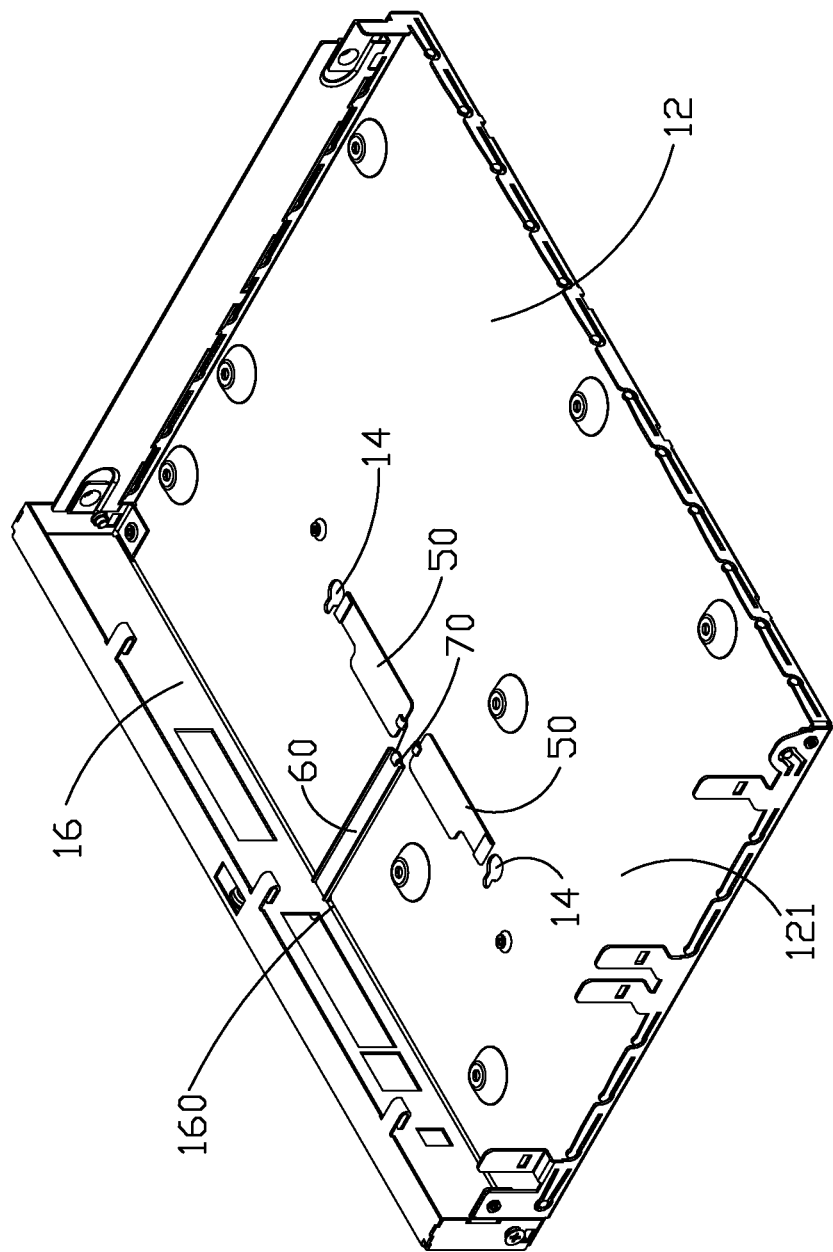
FIG. 5 is similar to FIG. 4, but showing the electronic device in an unlocked position.

Referring to FIG. 5, when the electronic device 100 is to be removed from the fasteners 90, an external force is put on the operating portion 68, and the operating portion 68 moves along the perpendicular bisector 180 and towards the accommodating hole 18. Correspondingly, the resilient member 70 is shrunk and drives the pair of sliding portions 50 move along the straight line 140 and toward to each other. Ultimately, the blocking portions 54 moves away from the second receiving holes 144, and the electronic device 100 can be removed from or fixed to the fasteners 90.

After the electronic device 100 is disengaged from the fastener 200 or hung on the fastener 200, the resilient member 70 decompresses and moves the sliding portions 50 relative to the enclosure 10 along the straight line 140 and away from each other until the blocking portions 54 blocks the second receiving holes 144, resulting in the electronic device 100 being in a locked position. In the locked position, the head of fastener cannot move between the first receiving holes 142 and the second receiving holes 144 and the electronic device 100 is secured to the fastener 200, avoiding damage or loss associated with accidental disengagement.

In sum, movements of the operating portion 68 relative to the enclosure along the perpendicular bisector 180 cause the blocking portions 54 of the pair of sliding portions 50 to move between blocking and being away from the pair of receiving portions 14, thereby the electronic device 100 being disposed between a locked and an unlocked position.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising:
   an enclosure, comprising a bottom wall defining a pair of receiving portions and a sidewall defining an accommodating hole, wherein centers of the pair of receiving portions define a straight line, and the accommodating hole is configured on a perpendicular bisector of the straight line; and
   a fixing member, comprising:
      a guiding part, attached to the bottom wall, the guiding part and the bottom wall collectively defining a receiving room;
      a pair of sliding portions, received in the receiving room and snugly moving along the straight line relative to the bottom wall, each of the pair of sliding portions comprising a hooking portion and a blocking portion respectively located two ends of the corresponding sliding portion;
      a control portion, snugly moving along the perpendicular bisector relative to the bottom wall and comprising a fixing portion received in the receiving room and an operating portion passing through the accommodating hole; and
      a resilient member, comprising a pair of driving ends engaging with the hooking portions and a triggering end engaging with the fixing portion;
      wherein movements of the control portion relative to the enclosure along the perpendicular bisector cause the blocking portions of the pair of sliding portions to move away from or cover the pair of receiving portions, thereby the electronic device being disposed between a locked and an unlocked position.

2. The electronic device as recited in claim 1, wherein the receiving portion is approximately gourd shaped and defines a first receiving hole and a second receiving hole in communication with the first receiving hole, area of a head of the fastener is greater than an area of the first receiving hole and less than an area of the second receiving hole.

3. The electronic device as recited in claim 1, wherein the guiding part comprises a main body attached to the bottom wall and a receiving portion projecting from the main body, the receiving room is collectively defined by the receiving portion and the bottom wall.

4. The electronic device as recited in claim 3, wherein the receiving portion is substantially T-shaped.

5. The electronic device as recited in claim 3, wherein each of the hooking portions comprises a first hook used to engage with one corresponding of the driving ends of the resilient member.

6. The electronic device as recited in claim 5, wherein the fixing portion comprises a second hook used to engage with the triggering end of the resilient member.

7. The electronic device as recited in claim 6, wherein the control portion comprises a base portion and a pair of limiting portions, the base portion is connected between the fixing portion and the operating portion, and the pair of limiting portions are projecting from the base portion via bending two side edges of the base portion to limit the base portion move into the accommodating hole.

8. The electronic device as recited in claim 7, wherein the resilient member is a torsion spring.

9. The electronic device as recited in claim 1, wherein the enclosure further comprises a plurality of sidewalls, the accommodating hole is defined in a common border of one of the sidewalls and the bottom wall.

* * * * *

UNITED STATES PATENT AND TRADEMARK OFFICE
CERTIFICATE OF CORRECTION

PATENT NO.         : 8,451,593 B2                                            Page 1 of 1
APPLICATION NO.    : 12/975227
DATED              : May 28, 2013
INVENTOR(S)        : Liang-Chun Ma It is certified that error appears in the above-identified patent and that said Letters Patent is hereby corrected as shown below:

Title Page, below Item (65) insert:

-- (30)     Foreign Application Priority Data

Mar. 11, 2010     (CN) ......................2010 2 0128486 --

Signed and Sealed this
Twenty-fourth Day of December, 2013

Margaret A. Focarino
*Commissioner for Patents of the United States Patent and Trademark Office*